United States Patent
Wilkerson

(10) Patent No.: US 10,419,256 B2
(45) Date of Patent: Sep. 17, 2019

(54) LOW POWER WIDEBAND NON-COHERENT BINARY PHASE SHIFT KEYING DEMODULATOR TO ALIGN THE PHASE OF SIDEBAND DIFFERENTIAL OUTPUT COMPARATORS FOR REDUCING JITTER, USING FIRST ORDER SIDEBAND FILTERS WITH PHASE 180 DEGREE ALIGNMENT

(71) Applicant: Benjamin P. Wilkerson, Incheon (KR)

(72) Inventor: Benjamin P. Wilkerson, Incheon (KR)

( * ) Notice: Subject to any disclaimer, the term of this patent is extended or adjusted under 35 U.S.C. 154(b) by 197 days.

(21) Appl. No.: 15/519,573

(22) PCT Filed: Oct. 15, 2015

(86) PCT No.: PCT/KR2015/010904
§ 371 (c)(1),
(2) Date: Apr. 17, 2017

(87) PCT Pub. No.: WO2016/060497
PCT Pub. Date: Apr. 21, 2016

(65) Prior Publication Data
US 2017/0257241 A1 Sep. 7, 2017

(30) Foreign Application Priority Data
Oct. 15, 2014 (KR) .................... 10-2014-0139396

(51) Int. Cl.
| | | |
|---|---|---|
| *H04L 27/233* | (2006.01) | |
| *H03K 5/24* | (2006.01) | |
| *H03K 19/017* | (2006.01) | |
| *H03K 19/0185* | (2006.01) | |
| *H03K 19/096* | (2006.01) | |
| *H04L 7/027* | (2006.01) | |
| *H04W 4/80* | (2018.01) | |

(52) U.S. Cl.
CPC ......... *H04L 27/233* (2013.01); *H03K 5/2481* (2013.01); *H03K 19/01728* (2013.01); *H03K 19/01855* (2013.01); *H03K 19/0963* (2013.01); *H04L 7/0278* (2013.01); *H04L 27/2331* (2013.01); *H04L 27/2334* (2013.01); *H04L 27/2335* (2013.01); *H04W 4/80* (2018.02)

(58) Field of Classification Search
CPC ............... H04L 27/233; H04L 27/2331; H04L 27/2334; H03K 5/2481; H03K 19/01855; H04W 4/80
USPC .................... 329/310, 345, 304; 375/328
See application file for complete search history.

(56) References Cited

FOREIGN PATENT DOCUMENTS

| | | |
|---|---|---|
| JP | 2931454 B2 | 8/1999 |
| KR | 10-0365982 B1 | 2/2003 |
| KR | 10-1306489 B1 | 9/2013 |

(Continued)

OTHER PUBLICATIONS

International Search Report dated Feb. 23, 2016 for International Application No. PCT/KR2015/010904.

*Primary Examiner* — Arnold M Kinkead
(74) *Attorney, Agent, or Firm* — Hauptman Ham, LLP

(57) ABSTRACT

An embodiment of the present invention relates to a low-power broadband asynchronous BPSK demodulation method and a configuration of a circuit thereof. In connection with a configuration of a BPSK demodulation circuit, there may be provided a low-power wideband asynchronous binary phase shift keying demodulation circuit comprising: a sideband separation and lower sideband signal delay unit; a data demodulation unit; and a data clock restoration unit.

7 Claims, 8 Drawing Sheets

(56) References Cited

FOREIGN PATENT DOCUMENTS

| KR | 20130104936 A | * | 9/2013 | ........... H04L 27/233 |
|---|---|---|---|---|
| KR | 10-1414288 B1 | | 7/2014 | |
| KR | 10-1415497 B1 | | 7/2014 | |
| KR | 10-1417593 B1 | | 7/2014 | |
| KR | 10-2004-0109971 A | | 12/2014 | |

* cited by examiner

LOW POWER WIDEBAND NON-COHERENT BINARY PHASE SHIFT KEYING DEMODULATOR TO ALIGN THE PHASE OF SIDEBAND DIFFERENTIAL OUTPUT COMPARATORS FOR REDUCING JITTER, USING FIRST ORDER SIDEBAND FILTERS WITH PHASE 180 DEGREE ALIGNMENT

CROSS-REFERENCE TO RELATED APPLICATION

This application is entering into the National Phase of PCT Application No. PCT/KR2015/010904, filed on Oct. 15, 2015, which claims priority from Korean Patent Application No. 10-2014-0139396, filed on Oct. 15, 2014 with the Korean Intellectual Property Office. The entire contents of which are hereby incorporated by reference into this application.

BACKGROUND OF THE INVENTION

1. Field of the Invention

The present invention relates to a low power wideband non-coherent BPSK demodulation method, and the structure of their circuit to demodulate data to align the phase 180° difference between the digitized signal of a differential output comparator that inputs the output of a $1^{st}$ order sideband filter that passes upper sideband and the delayed signal that is delayed with $\pi/2$ period of carrier frequency from the digitized signal of another differential output comparator that inputs the output of another $1^{st}$ order sideband filter that passes the lower sideband of BPSK modulation signal, and also to use a pair of digital signals that are lower sideband positive-phase and upper sideband negative-phase, and another pair of digital signals that are lower sideband negative-phase and upper sideband positive-phase from differential output comparators for minimizing glitches.

2. Background of the Invention

BPSK (Binary Phase Shift Keying) signal which is double sideband suppressed carrier signal is used with coherent BPSK demodulation method to synchronize by a carrier signal that is regenerated with an internal oscillator.

BPSK demodulation is basically used by COSTAS loop that is complicated circuit to consume a heavily power and to limit a transmission speed, because it uses a feed-back loop with an internal oscillator. Non-coherent DPSK demodulation circuit to use an analog integrator and switched-capacitor unit, is used with an internal oscillator and an analog integrator that are used with heavy power consumption and complicated circuits to use large area on chip, and has a drawback to discard whole packet data even one error in the packet occurred. Also, the yield of chip is decreased through the different characteristic of CMOS FET according to semiconductor fabrication process and the signal distortion problem according to the input offset of the differential output comparators.

According to a BPSK demodulation circuit, Korean registered patent KR-100365982 mentioned about a stable modulation and demodulation circuits to use synchronous signal generator in demodulation unit. According to PSK demodulation circuit, Korean registered patent KR-101417593 mentioned about a non-coherent demodulation method that has no internal oscillator.

SUMMARY OF THE INVENTION

According to an embodiment, the present invention relates to a low power wideband non-coherent binary phase shift keying (BPSK) demodulation method, and the structure of their circuit.

The structure of the BPSK demodulation circuit comprises: a sideband separation and lower sideband signal delay unit for separating a modulated signal into an upper sideband and a lower sideband through the first order high-pass filter and the first order low-pass filter in which a blocking frequency is same as a carrier frequency, positive-phase and negative-phase digital signals are digitized by lower sideband and upper sideband comparators for reducing jitter and increasing yield by comparison same rising edges and same falling edges between a symbol edge and next symbol edge in two pair of opposite phases from outputs of the sideband comparators, and outputting upper sideband digital signals and digital signals delayed as much as ¼ period of a carrier frequency from lower sideband digital signals; a data demodulation unit for demodulating digital data by synchronizing the delayed lower sideband positive-phase digital signal that is delayed from the output of the lower sideband comparator, with the falling edge of the symbol edge signal that symbol edge clock is generated without glitch by a deglitch filter whose input is from the output of an AND gate that reduces glitch with overlapping a $1^{st}$ symbol edge signal that is generated by aligning with a phase 180° difference between the delayed lower sideband positive-phase digital signal and the upper sideband negative-phase digital signal, and a $2^{nd}$ symbol edge signal that is generated by aligning with a phase 180° difference between the delayed lower sideband negative-phase digital signal and the upper sideband positive-phase digital signal; and a data clock recovering unit for generating a data clock by using the demodulated data signal and the delayed lower sideband positive-phase digital signal.

DESCRIPTION OF ILLUSTRATIVE EMBODIMENT

Figure 1:
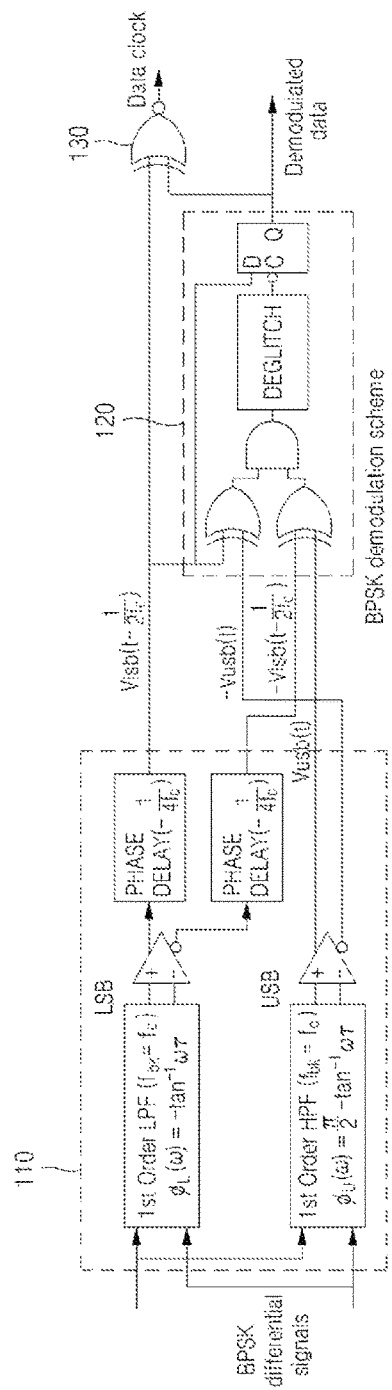
FIG. 1 is a circuit diagram to describe the structure of a low power wideband non-coherent BPSK demodulator that is considered with circuit stability and maximum yield, in accordance with an embodiment of the present invention.

According to the embodiment, the present invention provides BPSK demodulation circuit and its method using alignment to 180° in the phase difference of the first order sideband filters and also minimizing glitch in symbol edge signal for solving problems such as complicated circuit problem, transmission speed problem, and power consumption problem in conventional BPSK demodulation method.

The present invention provides simple non-coherent BPSK demodulation circuit and their method to transmit wideband digital data in low power, and the circuit is embodied by the yield improved circuit that has the high stability of circuit to complement by complementary symmetrical circuits to align the phase of lower sideband differential output comparator and upper sideband differential output comparator for minimizing glitches by reducing jitter because the output duty-cycle of sideband differential output comparators is changed by the difference of CMOS FET characteristic in semiconductor fabrication and the input off-set problem of the comparator.

According to the embodiment, the present invention provides a low power non-coherent BPSK demodulator which consists of a sideband separation and lower sideband signal delay unit that separates upper sideband analog signal and lower sideband analog signal by $1^{st}$ high-pass filter and $1^{st}$ low-pass filter with cutoff frequency same as carrier frequency, generates two pair of positive-phase and negative-phase signals that are upper sideband digital signals and lower sideband digital signals by differential output comparators where the phase difference of the outputs of the comparators whose inputs are sideband analog signals is ¼ period or $\pi/2$ of carrier frequency, and generates upper sideband digital signals and the delayed digital signals that are delayed from lower sideband digital signals with ¼ period or $\pi/2$ of carrier frequency; a data demodulation unit that demodulates data by D-flip-flop whose inputs are data (D) input that is the delayed lower sideband positive-phase digital signal and clock that is a symbol edge signal with no glitch by deglitch filter whose input is overlapping by an AND gate with a $1^{st}$ symbol edge signal that is generated by the difference of signals in phase changing edge because of aligning in phase $\pi$ or 180° difference between above upper sideband negative-phase digital signal and above delayed lower sideband positive-phase digital signal, and a $2^{nd}$ symbol edge signal that is generated by the difference of signals in phase changing edge because of aligning in phase $\pi$ or 180° difference between above upper sideband positive-phase digital signal and above delayed lower sideband negative-phase digital signal; a data clock recovery unit that generates data clock using the demodulated data signal and the lower sideband digital signal.

According to one side, the sideband separation and lower sideband signal delay unit includes a $1^{st}$ order HPF to separate upper sideband signal and a $1^{st}$ order LPF to separate lower sideband signal, from the BPSK modulated differential signal; and differential output comparators to convert a pair of digital signals that are lower sideband positive-phase and upper sideband negative-phase, and another pair of digital signals that are lower sideband negative-phase and upper sideband positive-phase. Also, the unit includes each delay circuit to delay with preset phase from the lower sideband positive-phase digital signal and lower sideband negative-phase digital signal.

According to another side, the data demodulation unit includes a $1^{st}$ Exclusive-OR gate that detects the $1^{st}$ symbol edge signal in phase changing portion by the difference of the digital signals because of aligning in phase $\pi$ or 180° difference between above upper sideband negative-phase digital signal and above delayed lower sideband positive-phase digital signal, and a $2^{nd}$ Exclusive-OR gate that detects the $2^{nd}$ symbol edge signal in phase changing portion by the difference of the digital signals because of aligning in phase $\pi$ or 180° difference between above upper sideband positive-phase digital signal and above delayed lower sideband negative-phase digital signal.

And the unit includes an AND gate that generates a $3^{rd}$ symbol edge signal to reduce jitters by overlapping the $1^{st}$ symbol edge signal and the $2^{nd}$ symbol edge signal, a deglitch filter that generates a symbol edge for phase detecting clock to remove the glitch of the $3^{rd}$ symbol edge signal, and a D-flip-flop.

The demodulated data signal can be generated by above D-flip-flop with data (D) input that is the delayed lower sideband positive-phase digital signal and clock (C) that is the symbol edge signal with no glitch.

According to another side, the data clock recovery unit can synchronize by data clock signal that is recovered by an exclusive-NOR with the input signals such as above demodulated data signal and above delayed lower sideband positive-phase digital signal.

According to the embodiment, the present invention provides a low power non-coherent BPSK demodulation method which consists of a sideband separation and lower sideband signal delayed stage, that separates upper sideband analog signal and lower sideband analog signal by $1^{st}$ high-pass filter and $1^{st}$ low-pass filter with cutoff frequency same as carrier frequency, generates two pair of positive-phase and negative-phase signals that are upper sideband digital signals and lower sideband digital signals by differential output comparators where the phase difference of the outputs of the comparators whose inputs are sideband analog signals is ¼ period or $\pi/2$ of carrier frequency, and generates upper sideband digital signals and the delayed digital signals that are delayed from lower sideband digital signals with ¼ period or $\pi/2$ of carrier frequency; a data demodulation stage that demodulates data by D-flip-flop whose inputs are data (D) input that is the delayed lower sideband positive-phase digital signal and clock that is a symbol edge signal with no glitch by deglitch filter whose input is overlapping by an AND gate with the $1^{st}$ symbol edge signal that is generated by the difference of signals in phase changing edge because of aligning in phase $\pi$ or 180° difference between above upper sideband negative-phase digital signal and above delayed lower sideband positive-phase digital signal, and the $2^{nd}$ symbol edge signal that is generated by the difference of signals in phase changing edge because of aligning in phase $\pi$ or 180° difference between above upper sideband positive-phase digital signal and above delayed lower sideband negative-phase digital signal; a data clock recovery stage that generates data clock using the demodulated data signal and the lower sideband digital signal.

According to the embodiment, the present invention provides a simple non-coherent BPSK demodulation circuit and their method to transmit wideband digital data for consuming a low power.

And the circuit has the high stability of circuit to complement by complementary symmetrical circuits to align the phase of lower sideband differential output comparator and upper sideband differential output comparator for minimizing glitches by reducing jitter because the output duty-cycle of sideband differential output comparators is changed by the difference of CMOS FET characteristic in semiconductor fabrication and the input off-set problem of the comparator.

Not only that, the present invention provides the demodulation method to be applied in high speed digital and mobile communication systems which are required low power consumption, and to be easily implemented in a low cost system on chip (SoC).

Below the embodiment, the present invention encompasses the details of the BPSK demodulation circuit topology and its method referring attached figures.

Referring now to FIG. 1, the circuit diagram of this invention for describing a low power wideband non-coherent BPSK demodulation topology that is considered with circuit stability and maximum yield is shown in it. In the circuit same as in FIG. 1, the BPSK circuit is comprised of a sideband separation and lower sideband signal delay unit 110, a data demodulation unit 120, and a data clock recovery unit 130.

First of all, the sideband separation and lower sideband signal delay unit 110 includes a $1^{st}$ order low-pass filter ($1^{st}$ order LPF) to separate lower sideband analog signal, a $1^{st}$ order high-pass filter ($1^{st}$ order HPF) to separate upper sideband analog signal, differential output comparators to convert a pair of digital signals that are lower sideband positive-phase and upper sideband negative-phase and another pair of digital signals that are lower sideband negative-phase and upper sideband positive-phase for the phase to minimize glitches where lower sideband and upper side band are aligned in phase 180°, and delay circuits to delay with preset phase from the lower sideband digital signals. The unit outputs an upper sideband digital signals and delayed lower sideband digital signals by each delay circuit from lower sideband digital signals in all digital signals that are converted by the comparators, when a modulation signal for input of the unit is separated to each sideband such as an upper sideband (USB) and a lower sideband (LSB). In this case, the sideband separation is composed of $1^{st}$ order filters whose cutoff frequency is same as carrier frequency, and an upper sideband signal and a lower sideband signal are acquired by $1^{st}$ order high-pass filter and $1^{st}$ order low-pass filter.

In this case, the lower sideband signal that is from the output of $1^{st}$ order filter, is occurred as slow as $\pi/2$ or ¼ period of carrier frequency rather than the upper sideband signal, and the delayed lower sideband signal is occurred through the delay circuit to delay $\pi/2$ or ¼ period of carrier frequency for minimizing glitches in phase changing edge with aligning phase $\pi$, or 180° difference between the delayed lower sideband signal and the upper sideband signal. In another word, the yield of integrated circuit is increased by minimizing glitches in phase changing edge with a pair of an upper sideband positive-phase signal and a delayed lower sideband negative-phase signal, and another pair of an upper sideband negative-phase signal and a delayed lower sideband positive-phase signal among the upper sideband digital signals and the delayed lower sideband digital signals.

Second of all, a data demodulation unit 120 consists of a $1^{st}$ Exclusive-OR gate, a $2^{nd}$ Exclusive-OR gate, an AND gate, a Deglitch filter and a D-flip-flop. The symbol edge signal that has fully no glitch can be generated by the Deglitch filter and the AND gate that overlaps a $1^{st}$ symbol edge signal and a $2^{nd}$ symbol edge signal, and the symbol edge signals are pulse signal on phase changing edge to detect data by comparing with the $1^{st}$ Exclusive-OR gate in above delayed lower sideband positive-phase digital signal and the upper sideband negative-phase digital signal, and the $2^{nd}$ Exclusive-OR gate in above delayed lower sideband negative-phase digital signal and the upper sideband positive-phase digital signal.

By comparing with the signals by each Exclusive-OR gate, the $1^{st}$ symbol edge and the $2^{nd}$ symbol edge signals that are pulse signal on phase changing edge to detect data are generated with glitch by jitter, because the phase differences of above delayed lower sideband digital differential output signals and above upper sideband digital differential output signals are aligned in phase 180°.

The $1^{st}$ symbol edge signal and the $2^{nd}$ symbol edge signal are generated with glitch that is generated by the jitter that is generated within $\pi/36$ by the remain of phase difference, because the $\pi/36$ of jitter that is caused by the rising delay (tPLH) and falling delay (tPHL) of the output driver and input offset of the comparators are cancelled by aligning of the phase of comparators. The signal to be generated by the AND gate has less glitch because of the glitches of the $1^{st}$ symbol edge signal and the $2^{nd}$ symbol edge signal are in no overlap or less overlap.

The symbol edge signal with no glitch is generated by the Deglitch filter from above signal that pulse signal is included with some glitch.

Above delayed lower sideband digital signal can be used in the data input of the D-flip-flop, and the symbol edge signal with no glitch can be used as detecting clock for demodulating data, also the synchronized data can be demodulated in the falling edge of the clock.

At this stage, the demodulated data is generated by the D-flip-flop with data (D) input that is the delayed lower sideband positive-phase digital signal and clock (C) that is the symbol edge signal with no glitch as referred to earlier.

Third of all, a data clock recovery unit 130 is composed of the Exclusive-NOR gate as shown in the figure.

In this case, a data clock is restored using the Exclusive-NOR with above delayed lower sideband positive-phase digital signal and above demodulated data signal.

Figure 2:
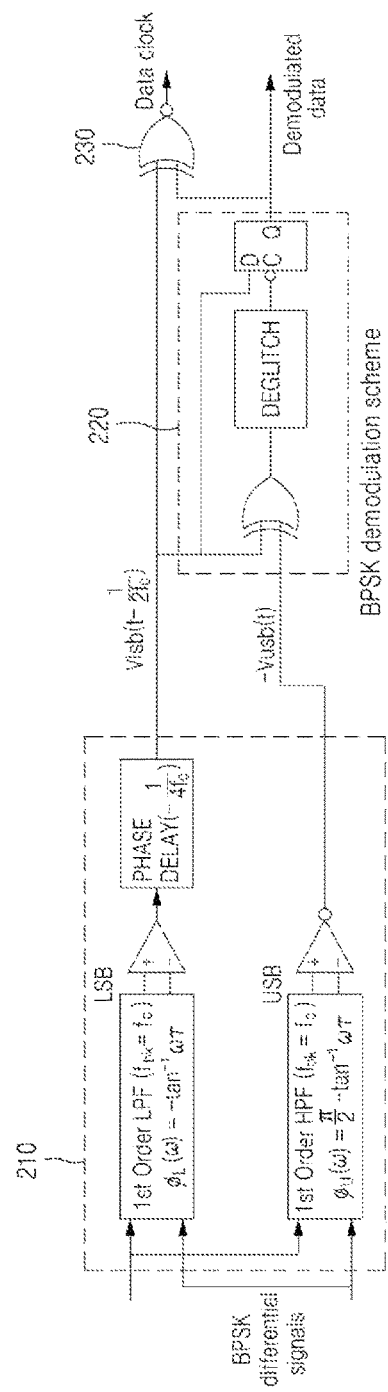
FIG. 2 is a circuit diagram to describe the structure of a simplified low power wideband non-coherent BPSK demodulator that eliminates a delay circuit, an AND gate and a $2^{nd}$ Exclusive-OR gate for trade-off between circuit stability and circuit simplicity, in accordance with an embodiment of the present invention.

Referring additionally now to FIG. 2, the circuit diagram of this invention for describing the simplified low power wideband non-coherent BPSK demodulator that eliminates a delay circuit, an AND gate and the 2nd Exclusive-OR gate for trade-off between circuit stability and circuit simplicity is shown in it. In the circuit same as in FIG. 2, the BPSK circuit is comprised of a sideband separation and lower sideband signal delay unit 210, a data demodulation unit 220, and a data clock recovery unit 230.

Figure 3:
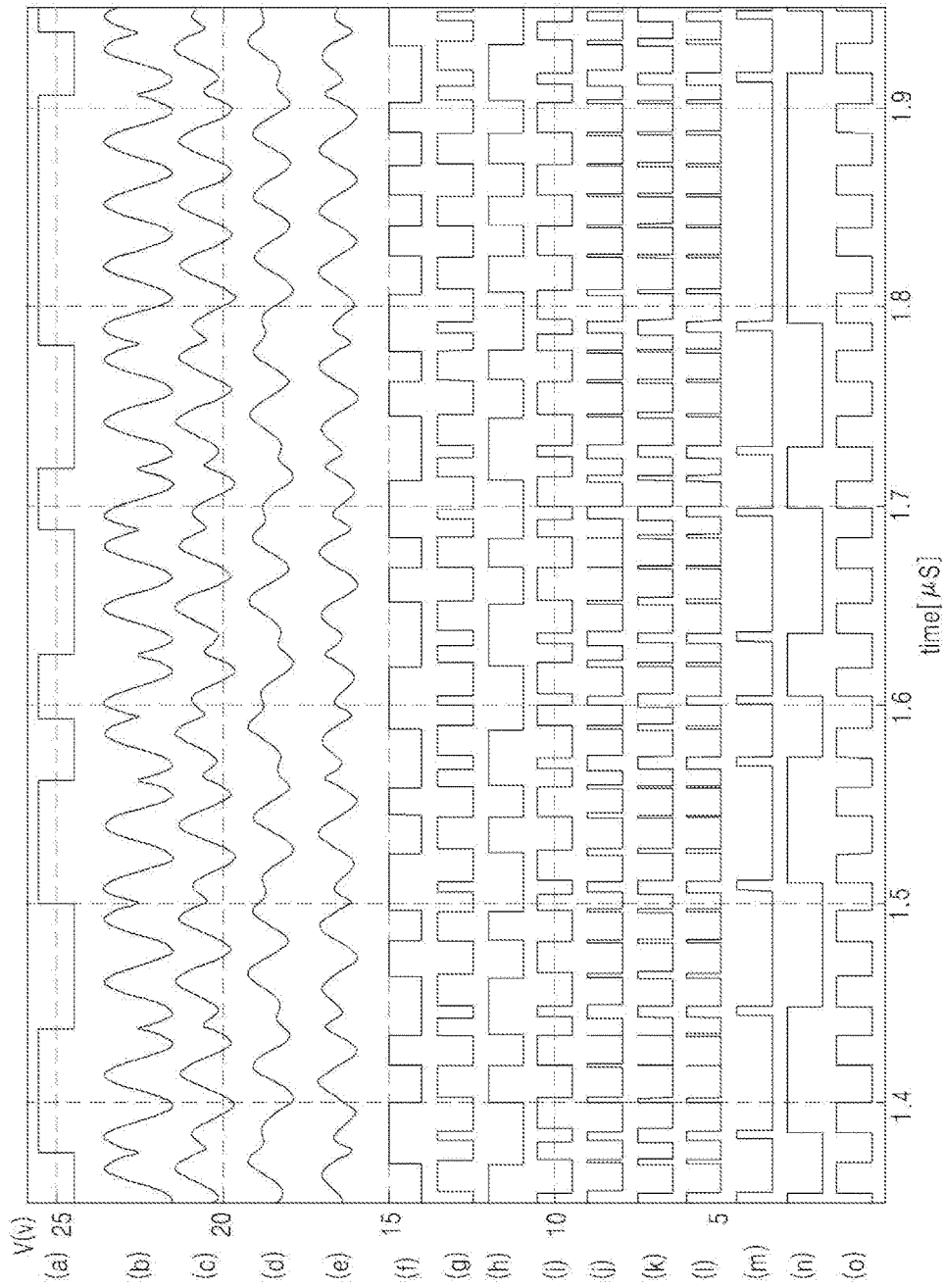
FIG. 3 is a timing diagram illustrating signals such as transmitter side signals that are included random data and a BPSK modulated signal in 32 MHz carrier frequency, receiver side signals, and a deglitched filter input that is a phase detecting signal with big glitches, in accordance with an embodiment of the previous invention that is considered with circuit stability.

Referring additionally now to FIG. 3, the timing diagrams of the previous invention, that is considered with circuit stability, with the random data of 32 Mbps transfer rate, transmitter side signal to modulate in BPSK using the random data and 32 MHz frequency carrier, and the signals which are processed the BPSK demodulation of receiver side are shown in it.

In the description of graphs from above to below, graph (a) is described as a random data signal to be modulated in transmitter side, graph (b) is described as a phase shift keying modulation signal to be measured in transmitter side, and graph (c) is described as a band-limited BPSK signal through a resonance circuit of the receiver side.

Also, graph (d) is described as the positive-phase signal of low-pass pre-filter (LPPF), graph (e) is described as the positive-phase signal of high-pass pre-filter (HPPF), graph (f) is described as the positive-phase digital signal among delayed signals from the digital signals of LPPF with ¼ period or π/2 of carrier frequency, graph (h) is described as the negative-phase digital signal among them, graph (g) is described as the positive-phase digital signal among HPPF digital signals, and graph (i) is described as the negative-phase digital signal among them.

And graph (j) is described as a $1^{st}$ symbol edge signal that has big glitches and is calculated by a $1^{st}$ Exclusive-NOR gate with the delayed lower sideband positive-phase digital signal and the upper sideband positive-phase signal, graph (k) is described as a $2^{nd}$ symbol edge signal that has big glitches and is calculated by a $2^{nd}$ Exclusive-NOR gate with the delayed lower sideband negative-phase digital signal and the upper sideband negative-phase signal, and graph (l) is described as a $3^{rd}$ symbol edge signal that is reduced the glitches by the AND gate.

And also, graph (m) is described as the symbol edge signal that passes the Deglitch filter, graph (n) is described as the data signal to be demodulated by the D-flip-flop, and finally graph (o) is described as a data clock signal to be recovered.

Figure 4:
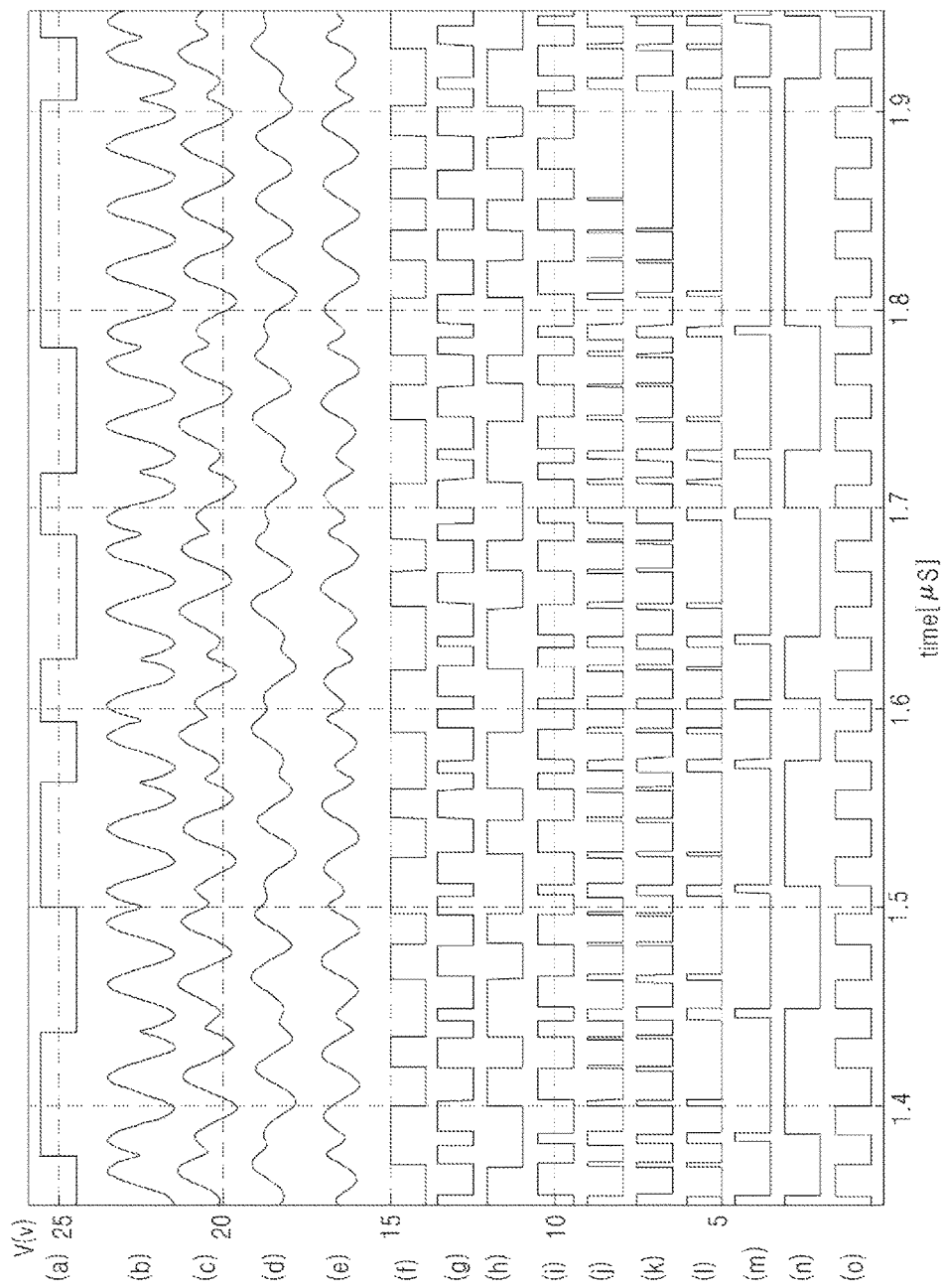
FIG. 4 is a timing diagram illustrating signals such as transmitter side signals that are included random data and a BPSK modulated signal in 32 MHz carrier frequency, receiver side signals, and a deglitched filter input that is a phase detecting signal with small glitches, in accordance with an embodiment of the present invention that is considered with maximum circuit stability.

Referring additionally now to FIG. 4, the timing diagrams of this invention, that is considered with maximum circuit stability, with the random data of 32 Mbps transfer rate, transmitter side signal to modulate in BPSK using the random data and 32 MHz frequency carrier, and the signals which are processed the BPSK demodulation of receiver side are shown in it.

In the description of graphs from above to below, graph (a) is described as a random data signal to be modulated in transmitter side, graph (b) is described as a phase shift keying modulation signal to be measured in transmitter side, and graph (c) is described as a band-limited BPSK signal through a resonance circuit of the receiver side.

Also, graph (d) is described as the positive-phase signal of $1^{st}$ order low-pass filter ($1^{st}$ order LPF), graph (e) is described as the negative-phase signal of $1^{st}$ order high-pass filter ($1^{st}$ order HPF), graph (f) is described as the positive-phase digital signal among delayed signals from the digital signals of $1^{st}$ order low-pass filter ($1^{st}$ order LPF) with ¼ period or π/2 of carrier frequency, graph (h) is described as the negative-phase digital signal among them, graph (g) is described as the negative-phase digital signal among the digital signals of $1^{st}$ order high-pass filter ($1^{st}$ order HPF), and graph (i) is described as the positive-phase digital signal among them.

And graph (j) is described as a $1^{st}$ symbol edge signal that has small glitches and is calculated by a $1^{st}$ Exclusive-NOR gate with the delayed lower sideband positive-phase digital signal and the upper sideband negative-phase signal, graph (k) is described as a $2^{nd}$ symbol edge signal that has small glitches and is calculated by a $2^{nd}$ Exclusive-NOR gate with the delayed lower sideband negative-phase digital signal and the upper sideband positive-phase signal, and graph (l) is described as a $3^{rd}$ symbol edge signal that is reduced the glitches by the AND gate.

And also, graph (m) is described as the symbol edge signal that passes the Deglitch filter, graph (n) is described as the data signal to be demodulated by the D-flip-flop, and finally graph (o) is described as a data clock signal to be recovered.

Figure 5:
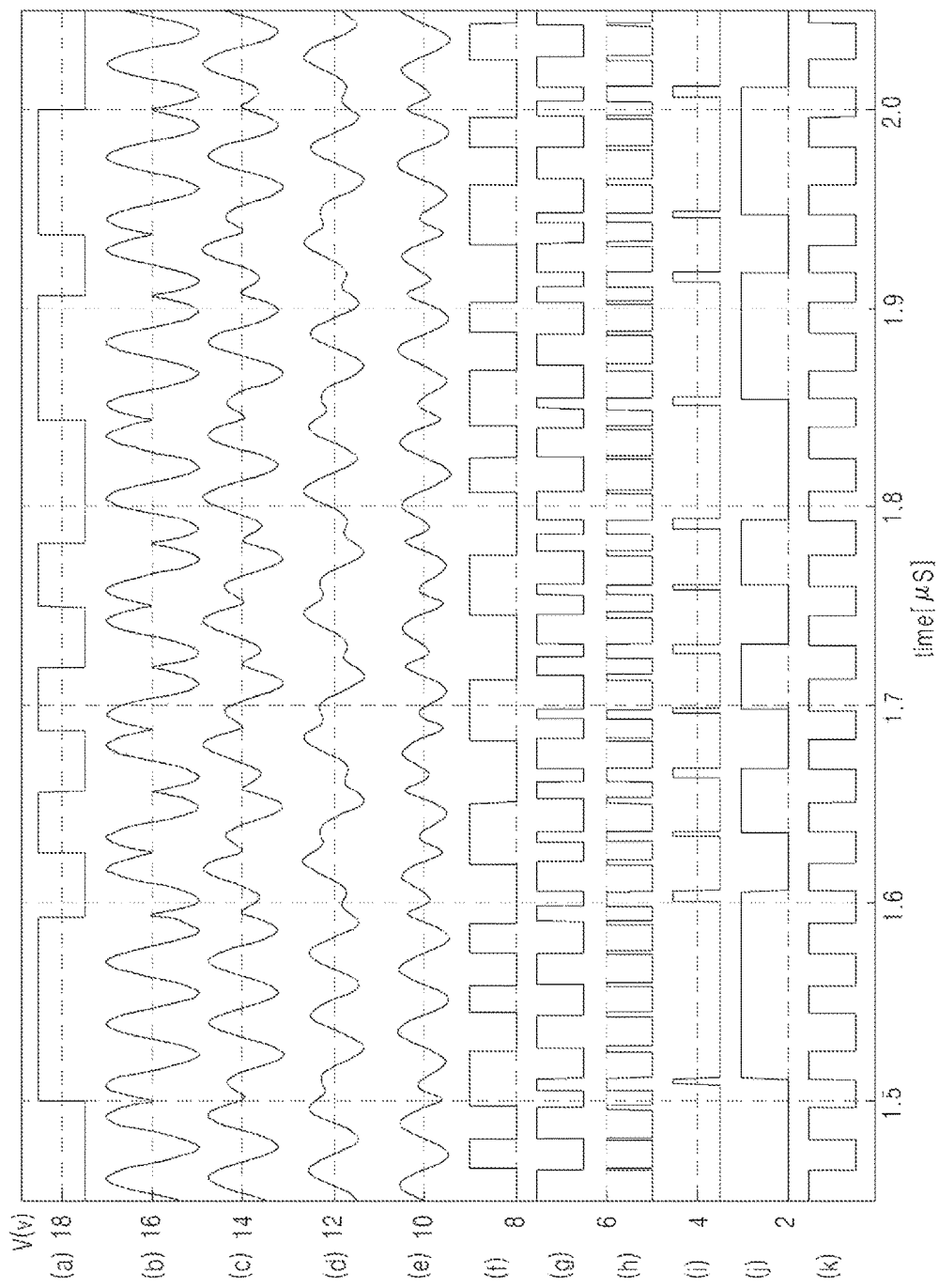
FIG. 5 is a timing diagram illustrating signals such as transmitter side signals that are included random data and a BPSK modulated signal in 32 MHz carrier frequency, receiver side signals, and a deglitched filter input that is a phase detecting signal with big glitches, in accordance with a simplified embodiment of the previous invention that is simplified circuit but reduces circuit stability.

Referring additionally now to FIG. 5, the timing diagrams of the previous invention, that is simplified circuit but reduces circuit stability, with the random data of 32 Mbps transfer rate, transmitter side signal to modulate in BPSK using the random data and 32 MHz frequency carrier, and the signals which are processed the BPSK demodulation of receiver side are shown in it.

In the description of graphs from above to below, graph (a) is described as a random data signal to be modulated in transmitter side, graph (b) is described as a phase shift keying modulation signal to be measured in transmitter side, and graph (c) is described as a band-limited BPSK signal through a resonance circuit of the receiver side.

Also, graph (d) is described as the positive-phase signal of low-pass pre-filter (LPPF), graph (e) is described as the positive-phase signal of high-pass pre-filter (HPPF), graph (f) is described as the positive-phase digital signal among delayed signals from the digital signals of LPPF with ¼ period or π/2 of carrier frequency, and graph (g) is described as the positive-phase digital signal among HPPF digital signals.

And also, graph (h) is described as the signal that has big glitches and is calculated by the Exclusive-NOR gate with the delayed lower sideband positive-phase digital signal and the upper sideband positive-phase signal, graph (i) is described as the symbol edge signal that passes the Deglitch filter, and also graph (j) is described as the data signal to be demodulated by the D-flip-flop, and finally graph (k) is described as a data clock signal to be recovered.

Figure 6:
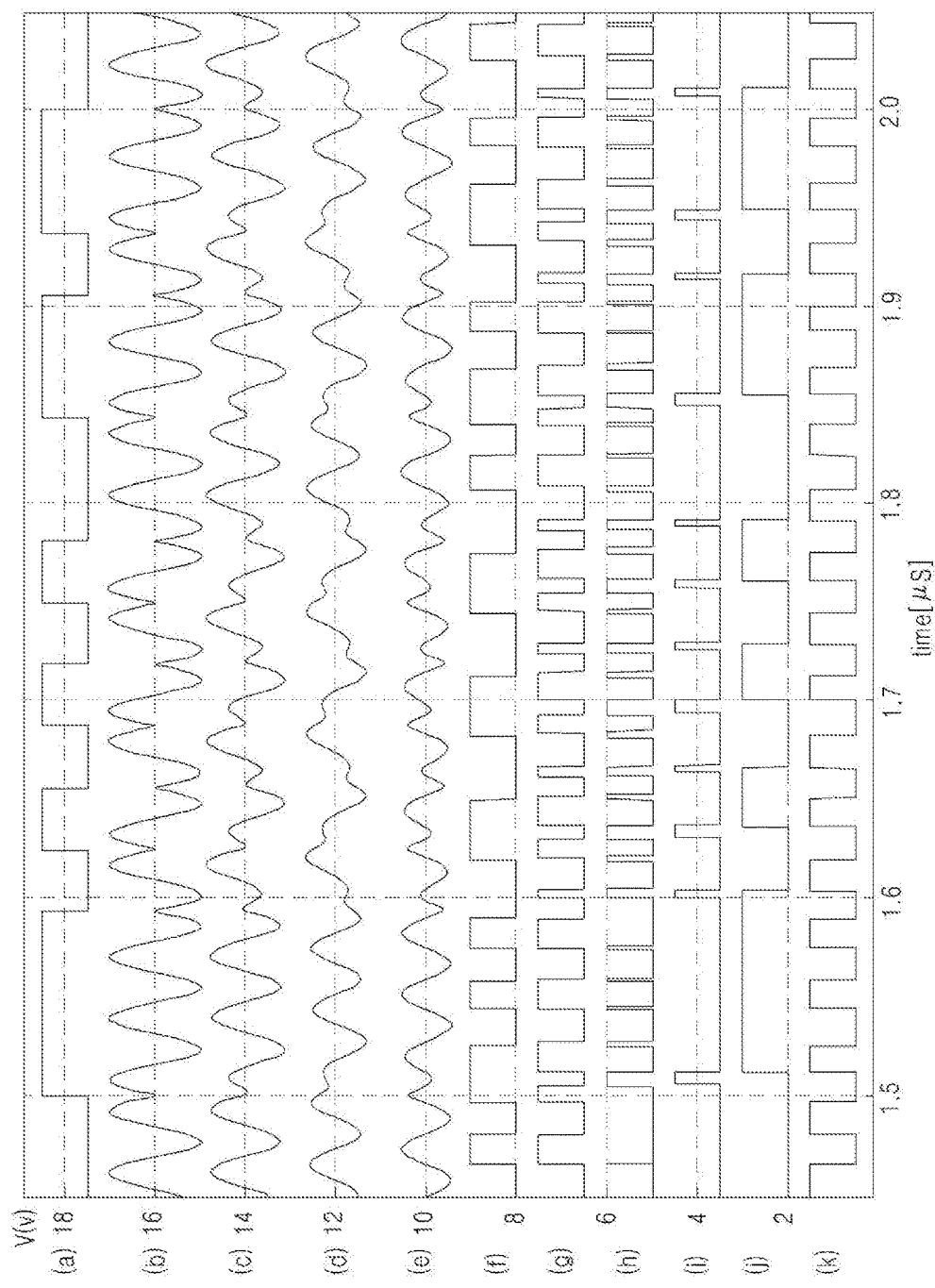
FIG. 6 is a timing diagram illustrating signals such as transmitter side signals that are included random data and a BPSK modulated signal in 32 MHz carrier frequency, receiver side signals, and a deglitched filter input that is a phase detecting signal with small glitches, in accordance with a simplified embodiment of the present invention for trade-off between maximum circuit stability and circuit simplicity.

Referring additionally now to FIG. 6, the timing diagrams of present invention for trade-off between maximum circuit stability and circuit simplicity, with the random data of 32 Mbps transfer rate, transmitter side signal to modulate in BPSK using the random data and 32 MHz frequency carrier, and the signals which are processed the BPSK demodulation of receiver side are shown in it.

In the description of graphs from above to below, graph (a) is described as a random data signal to be modulated in transmitter side, graph (b) is described as a phase shift keying modulation signal to be measured in transmitter side, and graph (c) is described as a band-limited BPSK signal through a resonance circuit of the receiver side.

Also, graph (d) is described as the positive-phase signal of $1^{st}$ order low-pass filter ($1^{st}$ order LPF), graph (e) is described as the negative-phase signal of $1^{st}$ order high-pass filter ($1^{st}$ order HPF), graph (f) is described as the positive-phase digital signal among delayed signals from the digital signals of $1^{st}$ order low-pass filter ($1^{st}$ order LPF) with ¼ period or π/2 of carrier frequency, graph (g) is described as the negative-phase digital signal among the digital signals of 1st order high-pass filter.

And also, graph (h) is described as the signal that has small glitches and is calculated by the Exclusive-NOR gate with the delayed lower sideband positive-phase digital signal and the upper sideband negative-phase signal, also graph (i) is described as the symbol edge signal that passes the Deglitch filter. And graph (j) is described as the data signal to be demodulated by the D-flip-flop, and finally graph (k) is described as a data clock signal to be recovered. The stable characteristics that are improved by the circuit are shown in FIG. 6, because the pulse width of the symbol edge signal as shown in the graph (i) of above FIG. 6 is increased through that the glitches as shown in the graph (h) of the figure are reduced than the glitches as shown in the graph (h) of above FIG. 5 like the timing diagrams of the previous invention that is simplified circuit but reduces circuit stability.

Each illustrated signal appears in a typically clear signal, and the demodulated signal is confirmed in a precise signal. For a practical technology that is used in 0.18 μm technology, for example, a high speed operation over 1 Gbps can be actualized in the demodulation method for even more speed.

Figure 7:
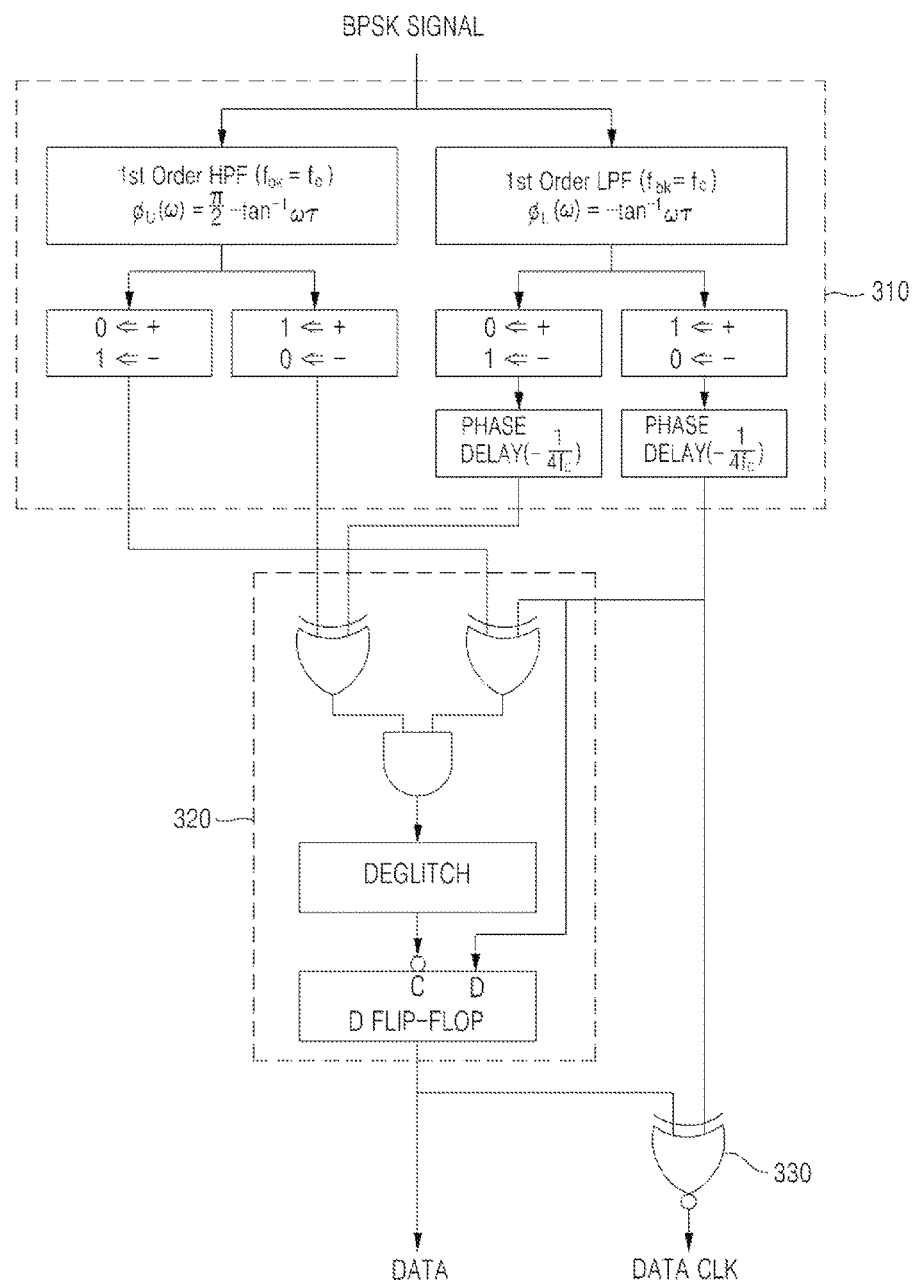
FIG. 7 is a flowchart to describe the demodulation method in a low power wideband non-coherent BPSK demodulator that is considered with circuit stability and maximum yield, in accordance with an embodiment of the present invention.

Referring additionally now to FIG. 7, the flowchart of this invention for describing a demodulation method to be performed in a low power wideband non-coherent BPSK demodulator that is considered with circuit stability and maximum yield is shown in it, and each stage can be conducted through the structure of a BPSK demodulation circuit that describes in FIG. 1.

In stage (310), an upper sideband and a lower sideband are separated from the modulated signal by a 1st HPF and a 1st LPF that separate to the upper sideband and lower sideband analog signals, and the digital signals are converted by each differential output comparator from the analog signals, also the delayed lower sideband digital signals are generated through the each delay circuit whose output signal is as slow as π/2 of carrier frequency rather than the lower sideband digital signal. This stage outputs a pair of digital signals that are in lower sideband positive-phase and in upper sideband negative-phase, and another pair of digital signals that are in lower sideband negative-phase and in upper sideband positive-phase.

In stage (320), the phase changing edge can be found through aligning with phase 180° in the phase difference between the delayed lower sideband digital signal and the upper sideband digital signal that are the outputs in stage (310). Among the output signals in stage (310), a 1st symbol edge signal is generated through a 1st Exclusive-OR gate that compares the delayed lower sideband positive-phase digital signal and the upper sideband negative-phase digital signal that digital signals are aligned in phase 180°.

Among the output signals in stage (310), a 2nd symbol edge signal is generated through a 2nd Exclusive-OR gate that compares the delayed lower sideband negative-phase digital signal and the upper sideband positive-phase digital signal that digital signals are aligned in phase 180°. And a 3rd symbol edge signal is generated by overlapping the 1st symbol edge signal and the 2nd symbol edge signal in the AND gate for reducing jitters that are occurred from the outputs of differential output comparators whose offset is changed from the semiconductor fabrications, also the symbol edge signal with no glitch is generated by the Deglitch filter from the 3rd symbol edge signal.

At this stage, the demodulated data is generated by the D-flip-flop with data (D) input that is the delayed lower sideband positive-phase digital signal and clock (C) that is the symbol edge signal with no glitch as referred to earlier.

Finally, in stage (330), a digital clock is recovered by an exclusive-NOR gate whose inputs are a signal that is digitized from the lower sideband analog signal among the outputs of stage (310) by a comparator, and the digital data that is demodulated in stage (320).

Figure 8:
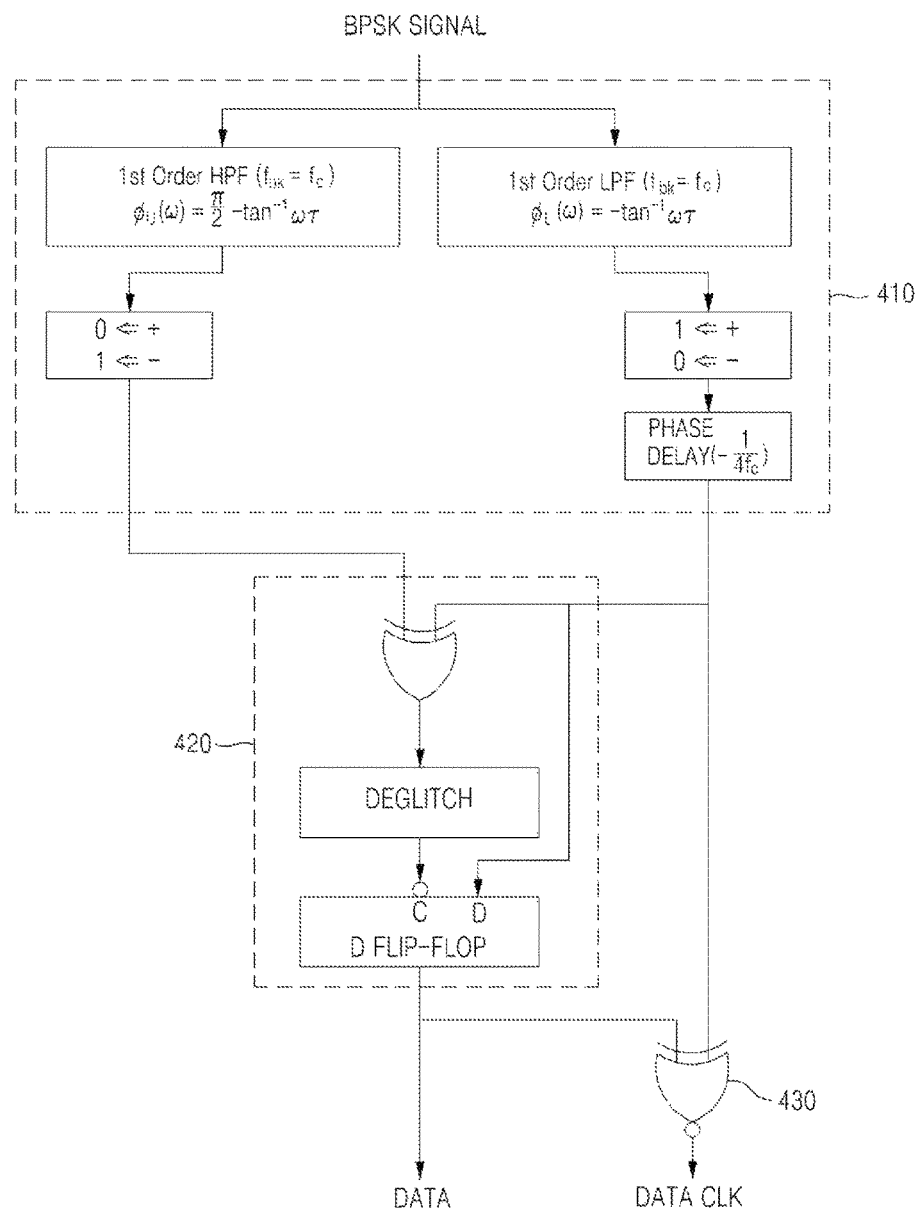
FIG. 8 is a flowchart to describe the demodulation method in a simplified low power wideband non-coherent BPSK demodulator that eliminates a delay circuit, an AND gate and a $2^{nd}$ Exclusive-OR gate for trade-off between circuit stability and circuit simplicity, in accordance with an embodiment of the present invention.

Referring additionally now to FIG. 8, the flowchart of this invention for describing a demodulation method to be performed in a simplified low power wideband non-coherent BPSK demodulator that eliminates a delay circuit, an AND gate and a 2nd Exclusive-OR gate for trade-off between circuit stability and circuit simplicity is shown in it, also the flowchart consists of a sideband separation and lower sideband signal delay stage (410), a data demodulation stage (420), and a data clock recovery stage (430), also each stage can be performed.

On top of that, the demodulation method to implement in digital communication and mobile communication device for consuming ultra low power is provided, also it applies a system on chip (SoC) in low cost.

Through the embodiment of the invention, a non-coherent BPSK demodulation method can be embodied in program instruction forms to be conducted by various computing methods, and saved in a computer readable media. The computer readable media can be included in stand alone or combination with data structure, data file and program instruction. The program instruction to be saved in above media will be possible to use what is constructed and specially designed, or announced by ordinary skilled of computer software for the embodiment. The examples of the computer readable recording media are a floppy disk, a hard disk, a magnetic media such as magnetic tape, an optical media such as DVD and CD-ROM, a magneto-optical media such as a floptical disk, and a particularly designed hardware device such as RAM, ROM and a flash memory to be saved and performed by program instruction. In the example of program instruction, it includes with a machine code that is constructed by a compiler, also a high level language to be executed using an interpreter by a computer. Above hardware device is organized to be operated into more than one software module for performing the operation of the embodiment, and the opposite is also.

While the invention has been particularly shown and described with reference to the preferred embodiments in the system, the structure, the device and the circuit thereof, it will be understood by those skilled in the art that the foregoing and other changes in form and details may be made therein without departing from the spirit and scope of the invention.

Therefore, another embodiments, another examples, and claims that are equivalent, are covered in the scope of following claims.

What is claimed is:

1. A low power wideband non-coherent binary phase shift keying (BPSK) demodulation circuit using first order sideband filters with phase 180 degree alignment, the low power wideband non-coherent BPSK demodulation circuit comprises:
   a sideband separation and lower sideband signal delay unit to output the upper sideband digital signals and the phase delayed digital signals with preset phase delay from lower sideband digital signals, when a BPSK modulation signal in the input of this separation unit is divided to the upper sideband and lower sideband analog signals by 1st order filters whose cutoff frequency is same as carrier frequency, and the analog signals are digitized to one pair of positive-phase and negative-phase upper sideband (USB) digital signals by an USB differential output comparator and another pair of delayed positive-phase and delayed negative-phase lower sideband (LSB) digital signals by a LSB differential output comparator with phase delay circuits;

a data demodulation unit to demodulate data through a $1^{st}$ symbol edge signal that is generated by a $1^{st}$ Exclusive-OR gate with the delayed positive-phase LSB digital signal and the negative-phase USB digital signal, and has glitches for using of detecting clock, a $2^{nd}$ symbol edge signal that is generated by a $2^{nd}$ Exclusive-OR gate with the delayed negative-phase LSB digital signal and the positive-phase USB digital signal, and has glitches for using of detecting clock, a $3^{rd}$ symbol edge signal whose glitches are reduced by overlapping the $1^{st}$ symbol edge signal and the $2^{nd}$ symbol edge signal, and the glitches of the $3^{rd}$ symbol edge signal are eliminated by the Deglitch filter for a symbol edge signal, and the data demodulation unit demodulates data using the symbol edge signal and the delayed lower sideband positive-phase digital signal; and a data clock recovery unit to recover data clock using the delayed lower sideband positive-phase digital signal and the demodulated digital data signal, also wherein the sideband separation and lower sideband signal delay unit comprises:
  a $1^{st}$ order low-pass filter ($1^{st}$ order LPF) whose cutoff frequency is the same as carrier frequency, configured to isolate lower sideband from the modulation signal;
  a $1^{st}$ differential output comparator to convert to positive-phase and negative-phase digital signals from lower sideband analog signal that is separated by the $1^{st}$ order LPF;
  a $1^{st}$ delay circuit to delay with preset phase from the lower sideband positive-phase digital signal;
  a $2^{nd}$ delay circuit to delay with preset phase from the lower sideband positive-phase digital signal;
  a $1^{st}$ order high-pass filter ($1^{st}$ order HPF) whose cutoff frequency is the same as carrier frequency, configured to isolate upper sideband from the modulation signal; and
  a $2^{nd}$ differential output comparator to convert to positive-phase and negative-phase digital signals from upper sideband analog signal that is separated by the $1^{st}$ order HPF, wherein the data demodulation unit comprises:
  the $1^{st}$ Exclusive-OR gate that compares the delayed lower sideband positive-phase digital signal and the upper sideband negative-phase digital signal;
  the $2^{nd}$ Exclusive-OR gate that compares the delayed lower sideband negative-phase digital signal and the upper sideband positive-phase digital signal;
  an AND gate that generates a $3^{rd}$ symbol edge signal that is the overlap of the $1^{st}$ symbol edge signal and the $2^{nd}$ symbol edge signal;
  a Deglitch filter that is a glitch removing circuit in analog or digital type, generates a symbol edge signal; and
  a D-flip-flop whose inputs are data (D) input that is the delayed lower sideband positive-phase digital signal and clock (C) that is the symbol edge signal, wherein the data clock recovery unit comprises:
  an exclusive-NOR gate to compare the delayed lower sideband positive-phase digital signal with the modulation data signal, and wherein the lower sideband digital signals that are separated through the $1^{st}$ order LPF and the $1^{st}$ differential output comparator, slower than the upper sideband digital signals by $\pi/2$ or ¼ period of carrier frequency, and the upper sideband signals are separated through the $1^{st}$ order HPF and the $2^{nd}$ differential output comparator, and the delay circuits to delay more ¼ period of carrier frequency from the lower sideband digital signals for two pair of signals whose phase difference are same as phase 180°, the $1^{st}$ symbol edge signal that is generated by the $1^{st}$ Exclusive-OR gate whose inputs are the delayed lower sideband positive-phase digital signal and the upper sideband negative-phase digital signal and the $2^{nd}$ symbol edge signal that is generated by the $2^{nd}$ Exclusive-OR gate whose inputs are the delayed lower sideband negative-phase digital signal and the upper sideband positive-phase digital signal are stable for demodulating data by non-coherent way in low power;

wherein the delayed lower sideband digital signals and the upper sideband digital signals are aligned in phase 180° for minimizing glitches, two pair of digital signals with each opposite phase to align in symbol edges to be compared in same rising edge and same falling edge such as a pair of digital signals that are in the delayed lower sideband positive-phase and upper sideband negative-phase, also another pair of digital signals that are in the delayed lower sideband negative-phase and upper sideband positive-phase for reducing glitches that are caused by minimum jitters; and to improve yield in the high stability of circuit that has the $3^{rd}$ symbol edge signal which is generated from the overlap of the $1^{st}$ symbol edge signal and the $2^{nd}$ symbol edge signal for minimizing glitches by reducing jitter because the output duty-cycle of sideband differential output comparators is changed by the difference of CMOS FET characteristic in semiconductor fabrication and the input off-set problem of the comparator.

2. The low power wideband non-coherent BPSK demodulation circuit of claim 1, wherein the sideband separation and lower sideband signal delay unit comprises a $1^{st}$ order LPF that isolates lower sideband, a $1^{st}$ order HPF that isolates upper sideband, each differential output comparator to digitize each sideband, and a delay circuits, also lower sideband digital signals that are digitized by the $1^{st}$ differential output comparator from the lower sideband analog signal, that is the output of the $1^{st}$ order LPF whose cutoff frequency is the same as carrier frequency, is $\pi/4$ or ⅛ period slower than the BPSK modulated signal, and upper sideband digital signals that are digitized by the $2^{nd}$ differential output comparator from the upper sideband analog signal, that is the output of the $1^{st}$ order HPF whose cutoff frequency is the same as carrier frequency, is $\pi/4$ or ⅛ period faster than the BPSK modulated modulation signal, and wherein the phase changing portion of the BPSK modulated signal can be securely found because of the stable phase difference between the $1^{st}$ order LPF output signal and the $1^{st}$ order HPF output signal is fixed to $\pi/2$ in a range from lower sideband to upper sideband at the center of carrier frequency, also the glitches are minimized by reducing jitters fully through comparing in same rising edge and same falling edge for matching opposite phase between the delayed lower sideband digital signals from the $1^{st}$ differential output comparator and the upper sideband digital signals from the 2$^{nd}$ differential output comparator.

3. The low power wideband non-coherent BPSK demodulation circuit of claim 1, wherein the data demodulation unit comprises a D-flip-flop whose inputs are data (D) input that is the delayed lower sideband positive-phase digital signal and clock (C) that is the symbol edge signal with no glitch.

4. The low power wideband non-coherent BPSK demodulation circuit of claim 1, wherein the data clock recovery unit comprises an exclusive-NOR gate, and to be with emphasis in the characteristic to recover a data clock through the output of the Exclusive-NOR gate with the delayed lower sideband positive-phase digital signal and the demodulated data signal.

5. The low power wideband non-coherent BPSK demodulation circuit of claim 1, wherein a simple low power wideband non-coherent BPSK demodulator using first order sideband filters with phase 180 degree alignment, the simple low power wideband non-coherent BPSK demodulation circuit comprises:
   a sideband separation and lower sideband signal delay unit to output the upper sideband negative-phase digital signal and the phase delayed digital signal with preset phase delay from lower sideband positive-phase digital signal, when a BPSK modulation signal in the input of this separation unit is divided to the upper sideband and lower sideband analog signals by 1$^{st}$ order filters whose cutoff frequency is same as carrier frequency, and the analog signals are digitized to a negative-phase upper sideband (USB) digital signal by an USB comparator and a delayed positive-phase lower sideband (LSB) digital signal by a LSB comparator with a phase delay circuit;
   a data demodulation unit to demodulate data through the symbol edge signal that has glitches for using detecting clock to use the delayed lower sideband positive-phase digital signal and the upper sideband negative-phase digital signal, the symbol edge signal whose glitches are eliminated by the Deglitch filter for a deglitched symbol edge signal, and this demodulation unit demodulates data using the deglitched symbol edge signal and the delayed lower sideband positive-phase digital signal; and
   a data clock recovery unit to recover data clock using the delayed lower sideband positive-phase digital signal and the demodulated digital data signal, also
   the sideband separation and lower sideband signal delay unit comprises:
      a 1$^{st}$ order low-pass filter (1$^{st}$ order LPF) whose cutoff frequency is the same as carrier frequency, configured to isolate lower sideband from the modulation signal;
      a 1$^{st}$ comparator to convert to positive-phase digital signal from lower sideband analog signal that is separated by the 1$^{st}$ order LPF;
      a delay circuit to delay with preset phase from the lower sideband positive-phase digital signal;
      a 1$^{st}$ order high-pass filter (1$^{st}$ order HPF) whose cutoff frequency is the same as carrier frequency, configured to isolate upper sideband from the modulation signal; and
      a 2$^{nd}$ comparator to convert to negative-phase digital signals from upper sideband analog signal that is separated by the 1$^{st}$ order HPF,
   the data demodulation unit comprises:
      an Exclusive-OR gate that compares the delayed lower sideband positive-phase digital signal and the upper sideband negative-phase digital signal;
      a Deglitch filter that is a glitch removing circuit in analog or digital type, generates a symbol edge signal; and
      a D-flip-flop whose inputs are data (D) input that is the delayed lower sideband positive-phase digital signal and clock (C) that is the symbol edge signal,
   the data clock recovery unit comprises:
      an exclusive-NOR gate to compare the delayed lower sideband positive-phase digital signal with the demodulation data signal,
   wherein the lower sideband positive-phase digital signal that is separated through the 1$^{st}$ order LPF and the 1$^{st}$ comparator, is occurred as slow as ¼ period of carrier frequency rather than the upper sideband digital signal that is separated through the 1$^{st}$ order HPF and the 2$^{nd}$ comparator, and the delay circuit to delay more ¼ period of carrier frequency for a pair of signals whose phase difference is same as phase 180°, the symbol edge signal that is generated by the Exclusive-OR gate whose inputs are the delayed lower sideband positive-phase digital signal and the upper sideband negative-phase digital signal is stable for demodulating data by non-coherent way in low power;
   where wherein the delayed lower sideband digital signal and the upper sideband digital signal are aligned in phase 180° that is the phase to minimize glitches, a pair of digital signals with each opposite phase to align in symbol edges to be compared in same rising edge and same falling edge such as a pair of digital signals that are in the delayed lower sideband positive-phase and upper sideband negative-phase for reducing glitches that are caused by small jitters; and
   to improve yield in the high stability of circuit that has the symbol edge signal for small glitches by reducing jitter because the comparator output duty-cycle is changed by the difference of CMOS FET characteristic in fabrication and the input off-set problem of the comparator.

6. A low power wideband non-coherent binary phase shift keying (BPSK) demodulation method using first order sideband filters with phase 180 degree alignment, the low power wideband non-coherent BPSK demodulation method comprises:
   a sideband separation and lower sideband signal delay step to output the upper sideband digital signals and the phase delayed digital signals with preset phase delay from lower sideband digital signals, when a BPSK modulation signal in the input of this step is divided to the upper sideband and lower sideband analog signals by 1$^{st}$ order filters whose cutoff frequency is same as carrier frequency, and the analog signals are digitized to one pair of positive-phase and negative-phase upper sideband (USB) digital signals by an USB differential output comparator and another pair of delayed positive-phase and delayed negative-phase lower sideband (LSB) digital signals by a LSB differential output comparator with phase delay circuits;
   a data demodulation step to demodulate data through a 1$^{st}$ symbol edge signal that has glitches for using detecting clock to use the delayed lower sideband positive-phase digital signal and the upper sideband negative-phase digital signal, a 2$^{nd}$ symbol edge signal that has glitches for using detecting clock to use the delayed lower sideband negative-phase digital signal and the upper sideband positive-phase digital signal, a 3$^{rd}$ symbol edge signal whose glitches are reduced by overlapping the 1$^{st}$ symbol edge signal and the 2$^{nd}$ symbol edge signal, the symbol edge signal whose glitches are eliminated by the Deglitch filter, and the step demodulates data using the symbol edge signal and the delayed lower sideband positive-phase digital signal; and a data clock recovery step to recover data clock using the delayed lower sideband positive-phase digital signal and the demodulated digital data signal, also wherein the sideband separation and lower sideband signal delay step comprises:

a 1$^{st}$ order low-pass filter (1$^{st}$ order LPF) whose cutoff frequency is the same as carrier frequency, configured to isolate lower sideband from the modulation signal;

a 1$^{st}$ differential output comparator to convert to positive-phase and negative-phase digital signals from lower sideband analog signal that is separated by the 1$^{st}$ order LPF;

a 1$^{st}$ delay circuit to delay with preset phase from the lower sideband positive-phase digital signal;

a 2$^{nd}$ delay circuit to delay with preset phase from the lower sideband positive-phase digital signal;

a 1$^{st}$ order high-pass filter (1$^{st}$ order HPF) whose cutoff frequency is same as carrier frequency, configured to isolate upper sideband from the modulation signal; and a 2$^{nd}$ differential output comparator to convert to positive-phase and negative-phase digital signals from upper sideband analog signal that is separated by the 1$^{st}$ order HPF, wherein the data demodulation step comprises:

the 1$^{st}$ Exclusive-OR gate that compares the delayed lower sideband positive-phase digital signal and the upper sideband negative-phase digital signal;

the 2$^{nd}$ Exclusive-OR gate that compares the delayed lower sideband negative-phase digital signal and the upper sideband positive-phase digital signal;

an AND gate that generates the 3$^{rd}$ symbol edge signal that is the overlap of the 1$^{st}$ symbol edge signal and the 2$^{nd}$ symbol edge signal;

a Deglitch filter that is a glitch removing circuit in analog or digital type, generates a symbol edge signal; and a D-flip-flop whose inputs are data (D) input that is the delayed lower sideband positive-phase digital signal and clock (C) that is the symbol edge signal, wherein the data clock recovery step comprises:

an exclusive-NOR gate to compare the delayed lower sideband positive-phase digital signal with the modulation data signal, and wherein the lower sideband digital signals that are separated through the 1$^{st}$ order LPF and the 1$^{st}$ differential output comparator, slower than the upper sideband digital signals by π/2 or ¼ period of carrier frequency, and the upper sideband signals are separated through the 1$^{st}$ order HPF and the 2$^{nd}$ differential output comparator, and the delay circuits to delay more ¼ period of carrier frequency from the lower sideband digital signals for two pair of signals whose phase difference are same as phase 180°, the 1$^{st}$ symbol edge signal that is generated by the 1$^{st}$ Exclusive-OR gate whose inputs are the delayed lower sideband positive-phase digital signal and the upper sideband negative-phase digital signal and the 2$^{nd}$ symbol edge signal that is generated by the 2$^{nd}$ Exclusive-OR gate whose inputs are the delayed lower sideband negative-phase digital signal and the upper sideband positive-phase digital signal are stable for demodulating data by non-coherent way in low power;

wherein the delayed lower sideband digital signals and the upper sideband digital signals are aligned in phase 180° that is the phase to minimize glitches, two pair of digital signals with each opposite phase to align in symbol edges to be compared in same rising edge and same falling edge such as a pair of digital signals that are in the delayed lower sideband positive-phase and upper sideband negative-phase, also another pair of digital signals that are in the delayed lower sideband negative-phase and upper sideband positive-phase for reducing glitches that are caused by minimum jitters; and to improve yield in the high stability of circuit that has the 3rd symbol edge signal which is generated from the overlap of the 1$^{st}$ symbol edge signal and the 2$^{nd}$ symbol edge signal for minimizing glitches by reducing jitter because the output duty-cycle of sideband differential output comparators is changed by the difference of CMOS FET characteristic in semiconductor fabrication and the input off-set problem of the comparator.

7. The low power wideband non-coherent BPSK demodulation method of claim 6, a simple low power wideband non-coherent BPSK demodulation method using first order sideband filters with phase 180 degree alignment, simple low power wideband non-coherent BPSK demodulation method comprises:

a sideband separation and lower sideband signal delay step to output the upper sideband negative-phase digital signal and the phase delayed digital signal with preset phase delay from lower sideband positive-phase digital signal, when a BPSK modulation signal in the input of this step is divided to the upper sideband and lower sideband analog signals by 1$^{st}$ order filters whose cutoff frequency is same as carrier frequency;

a data demodulation step to demodulate data through the symbol edge signal that has glitches for using detecting clock to use the delayed lower sideband positive-phase digital signal and the upper sideband negative-phase digital signal, the symbol edge signal whose glitches are eliminated by the Deglitch filter, and the step demodulates data using the symbol edge signal and the delayed lower sideband positive-phase digital signal; and a data clock recovery step to recover data clock using the delayed lower sideband positive-phase digital signal and the demodulated digital data signal, also the sideband separation and lower sideband signal delay step comprises:

a 1$^{st}$ order low-pass filter (1$^{st}$ order LPF) whose cutoff frequency is same as carrier frequency, configured to isolate lower sideband from the modulation signal;

a 1$^{st}$ comparator to convert to positive-phase digital signal from lower sideband analog signal that is separated by the 1$^{st}$ order LPF;

a delay circuit to delay with preset phase from the lower sideband positive-phase digital signal;

a 1$^{st}$ order high-pass filter (1$^{st}$ order HPF) whose cutoff frequency is same as carrier frequency, configured to isolate upper sideband from the modulation signal; and a $2^{nd}$ comparator to convert to negative-phase digital signals from upper sideband analog signal that is separated by the $1^{st}$ order HPF, the data demodulation step comprises:

an Exclusive-OR gate that compares the delayed lower sideband positive-phase digital signal and the upper sideband negative-phase digital signal;

a Deglitch filter that is a glitch removing circuit in analog or digital type; and a D-flip-flop whose inputs are data (D) input that is the delayed lower sideband positive-phase digital signal and clock (C) that is the symbol edge signal, the data clock recovery step comprises:

an exclusive-NOR gate to compare the delayed lower sideband positive-phase digital signal with the modulation data signal, wherein the lower sideband positive-phase digital signal that is separated through the $1^{st}$ order LPF and the $1^{st}$ comparator, is occurred as slow as ¼ period of carrier frequency rather than the upper sideband digital signal that is separated through the $1^{st}$ order HPF and the $2^{nd}$ comparator, and the delay circuit to delay more ¼ period of carrier frequency for a pair of signals whose phase difference is same as phase 180°, the symbol edge signal that is generated by the Exclusive-OR gate whose inputs are the delayed lower sideband positive-phase digital signal and the upper sideband negative-phase digital signal is stable for demodulating data by non-coherent way in low power;

wherein the delayed lower sideband digital signal and the upper sideband digital signal are aligned in phase 180° that is the phase to minimize glitches, a pair of digital signals with each opposite phase to align in symbol edges to be compared in same rising edge and same falling edge such as a pair of digital signals that are in the delayed lower sideband positive-phase and upper sideband negative-phase for reducing glitches that are caused by small jitters; and to improve yield in the high stability of circuit that has the symbol edge signal for small glitches by reducing jitter because the comparator output duty-cycle is changed by the difference of CMOS FET characteristic in fabrication and the input off-set problem of the comparator.

* * * * *